United States Patent
Boyer et al.

(10) Patent No.: US 6,981,198 B2
(45) Date of Patent: Dec. 27, 2005

(54) DYNAMIC ERROR CORRECTION CODE SHORTENING

(75) Inventors: Keith Gary Boyer, Thornton, CO (US); Richard Allen Gill, Arvada, CO (US)

(73) Assignee: Storage Technology Corporation, Louisville, CO (US)

(*) Notice: Subject to any disclaimer, the term of this patent is extended or adjusted under 35 U.S.C. 154(b) by 577 days.

(21) Appl. No.: 09/843,269

(22) Filed: Apr. 26, 2001

(65) Prior Publication Data
US 2002/0162070 A1 Oct. 31, 2002

(51) Int. Cl.[7] .......................................... H03M 13/00
(52) U.S. Cl. .................................... 714/774; 714/779
(58) Field of Search ............................. 714/755, 758, 714/752, 756, 763, 765, 776, 779, 774; 360/70

(56) References Cited

U.S. PATENT DOCUMENTS

| | | | |
|---|---|---|---|
| 4,651,239 A * | 3/1987 | Omori et al. ............ 360/77.14 |
| 5,063,533 A * | 11/1991 | Erhart et al. .............. 711/157 |
| 5,392,299 A * | 2/1995 | Rhines et al. ............. 714/756 |
| 6,158,038 A * | 12/2000 | Yamawaki et al. ........ 714/755 |
| 6,181,869 B1 * | 1/2001 | Kaneshige et al. .......... 386/70 |
| 6,216,247 B1 * | 4/2001 | Creta et al. ............... 714/763 |
| 6,349,400 B1 * | 2/2002 | Senshu ..................... 714/769 |

* cited by examiner

Primary Examiner—Albert Decady
Assistant Examiner—Mujtaba Chaudry
(74) Attorney, Agent, or Firm—Brooks Kushman P.C.

(57) ABSTRACT

A method and system are provided for dynamically shortening a number of error correction codewords to correspond to an amount of user data to be recorded on a recording medium. The system and method determine in advance that the number of bytes of user data will only fill a portion of a codeword matrix, and automatically shortens the size of ECC word segments to match the actual user data fill. This allows an ECC interleave to be completed with only a partial fill of the matrix, thereby reducing the required number of recording passes and associated processing time.

12 Claims, 2 Drawing Sheets

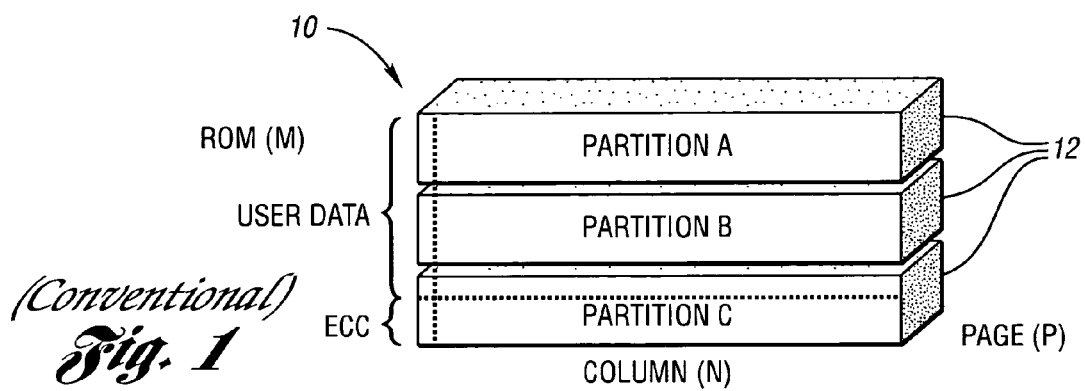
*Fig. 1* (Conventional)

DYNAMIC ERROR CORRECTION CODE SHORTENING

BACKGROUND OF THE INVENTION

1. Field of the Invention

The present invention relates to error correction coding (ECC) arrangements used in connection with digital recording devices, and more particularly to an improved method and apparatus for processing interleaved codewords.

2. Background Art

Generally, error correction codes (ECC) are commonly employed when communicating data between different devices. As is well understood, these codes provide a level of data redundancy that allows corrupted data to be identified and corrected at the time of communication. Of particular interest to the present invention is the use of error correction codes when recording digital data. Error correction codes used with modern digital recording devices typically employ a technique for interleaving codeword elements to form multi-dimensional matrices from many error correction codewords. Interleaving techniques allow the codeword elements to be physically separated and distributed over multiple tracks on the recording medium.

An example of such a multi-dimensional matrix is illustrated in FIG. 1. As shown, a matrix 10 is formed from P number of pages, each having M number of rows and N number of columns. The contents of each row are recorded on the same track of a recording device. A predetermined number of partitions 12 are used to "hold" a correspondingly sized portion of the user data. In this example, three partitions A, B, and C are provided. User data is typically filled in one dimension of the matrix. The associated ECC codewords are appended to the end of the data in the same dimension.

The ECC interleave is typically accomplished by splitting each ECC word into segments having a predetermined number of bytes, and recording each ECC segment on a different track on the recording medium. Thus, each ECC word is recorded across multiple tracks of the recording device. When all segments of the ECC word are recorded, the next word is segmented and recorded in a similar manner. As a result, each segment of a codeword can be represented (row, column, page) as follows: A(1, 1, 1), A(2, 1, 1), A(3, 1, 1), . . . , A(M/no. of partions, 1, 1), B(1, 1, 1), B(2, 1, 1), B(3, 1, 1), . . . , B(M/no. of partions, 1, 1), C(1, 1, 1), C(2, 1, 1), C(3, 1, 1), . . . , C(M/no. of partions, 1, 1).

The drawback of such an interleaving arrangement is that an entire matrix must be recorded to achieve the full interleave effect. To fully record one matrix, multiple passes, i.e., 3*M passes in the example of FIG. 1, of N words must be made. As a result, if the size of a user's data does not equal an integer multiple of the user data portion of the matrix, pad bytes must be provided at the end of the last partition of data in order to fill the partition and complete the matrix.

The use of such additional pad bytes, as well as the requirement that each recording pass must be made in order to complete the matrix and ECC interleave, reduces the overall efficiency of such interleaving arrangements. Therefore, a need exists for an improved ECC interleaving arrangement that does not require recording of a full matrix when a user's data does not fill the entire user data portion of the matrix.

SUMMARY OF THE INVENTION

The present invention addresses the above-described need and improves overall efficiency by determining in advance that the number of bytes of user data will only fill a portion of the matrix, and automatically shortening the number of ECC word segments to match the actual user data fill. This allows the interleave to be completed with only a partial fill of the matrix, thereby reducing the required number of recording passes and associated processing time.

In accordance with one aspect of the present invention, a method is provided for dynamically shortening error correction codewords used in an error correction code interleaving arrangement that divides error correction codewords into segments for recording across a codeword matrix. The method includes receiving user data for recording on a storage medium, determining the size of the received user data and the amount of matrix that will be filled by the received user data, and recording error correction codewords segments in an interleave that corresponds only to the portion of the matrix filled by the user data.

In addition, the method can include reading the data from the storage medium, and determining that the data only fills a portion of the matrix. The error correction codewords are then automatically recreated as a function of the dynamically created interleave recorded on the medium. Reading the data from the storage medium further includes determining the number of error codeword segments corresponding the partial data fill.

In accordance with another aspect of the present invention, a system is provided for dynamically shortening error correction codewords used in an error correction code interleaving arrangement. The system includes a data buffer for receiving user data. The data buffer includes a processing arrangement for determining the amount of data received in the data buffer. An error correction code write buffer is connected to the data buffer for receiving the user data as well as an indication of the amount of data. The write buffer includes a processing arrangement for determining a shortening value for error correction codeword that correspond to the amount of user data, and recording the user data and the error correction codeword on a recording medium.

In addition, the write buffer processing arrangement is further arranged to divide each of the shortened error correction codewords into a plurality of segments, and record each segment on a different track. Still further, the write buffer processing arrangement can be arranged to process the user data into a predetermined number of partitions each dimensioned to hold a predetermined number of bytes of user data, and only partitions corresponding to the amount of user data are filled.

In accordance with yet another aspect, the system includes an error correction read buffer having a processing arrangement for reading the data from the storage medium, and determining that the data only fills a portion of an error correction codeword matrix, wherein the read buffer processing arrangement automatically determines a shortening level of error codewords corresponding to the partial data fill.

These aspects, features, and advantages of the present invention will be readily apparent from the following detailed description of the best mode for carrying out the invention when taken in connection with the accompanying drawings.

BRIEF DESCRIPTION OF THE DRAWINGS

FIG. 1 is a block diagram representing a conventional ECC interleaving arrangement and resulting multi-dimensional matrix;

DETAILED DESCRIPTION OF THE PREFERRED EMBODIMENT(S)

Figure 2:
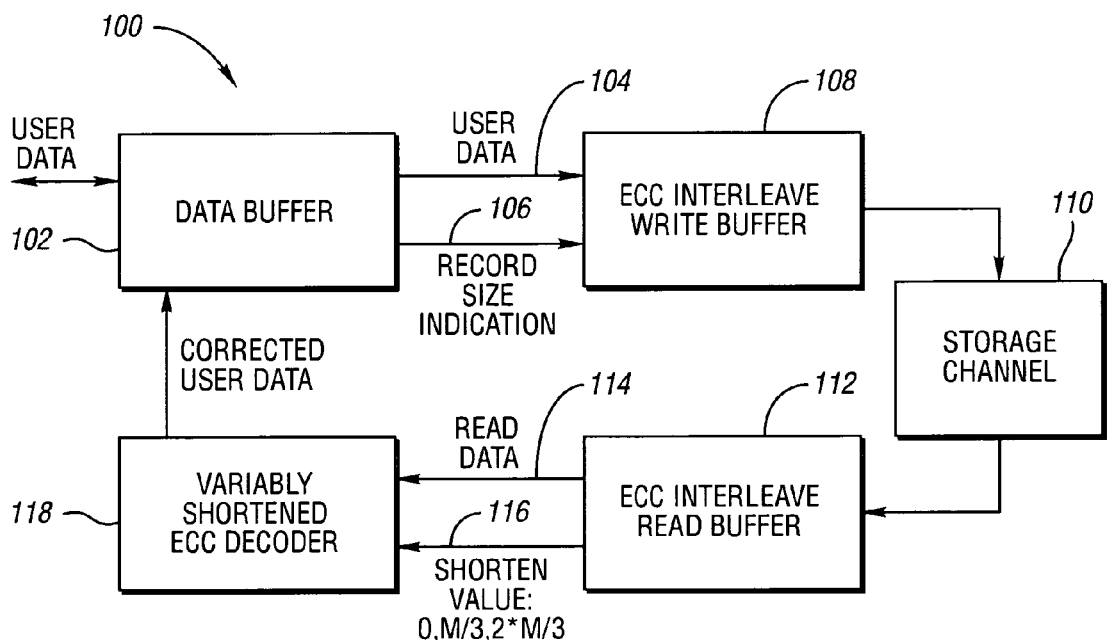
FIG. 2 is a functional block diagram of a data processing system in accordance with the present invention.

Referring to FIG. 2, a functional block diagram illustrates a system 100 for providing dynamic error correction code (ECC) shortening in accordance with the present invention. As shown, user data is initially received in a data buffer 102. In accordance with the present invention, the actual size of the data received in the data buffer is determined. The user data as well as the size of the data are then communicated to an ECC interleave write buffer 108 as denoted by lines 104 and 106 respectively.

As described below, the ECC write buffer includes a processing arrangement programmed to automatically create a codeword matrix having error correction codeword segments corresponding only to the portion of the codeword matrix filled by the user data. The user data and interleaved ECC is then recorded on a recording medium or channel 110.

When the data is subsequently read from the medium, the data is communicated to an ECC interleave read buffer 112. The logic/processing system associated with ECC interleave read buffer 112 is arranged to determine the amount of data read out of the storage channel as part of the read process. Because the process knows the amount of data present, the read buffer will generate the shortening value of the ECC codewords that correspond to the amount of data read from the storage channel. As described below, the size of the codewords is determined as a function of the number of partitions filled by the user data. If all the partitions were filled, a shorten value of 0 (zero) is used. If less than all the partitions were filled, a shorten value is determined as follows: M*(No. of partitions−No. of partitions filled)/No. of partitions. The read data and the shorten value are communicated to a variably shortened ECC decoder 118 via lines 114 and 116 respectively.

The ECC decoder reproduces the ECC codewords and corrects the user data accordingly. The corrected user data is then forwarded to data buffer 102 for communication to the user.

Figure 3:
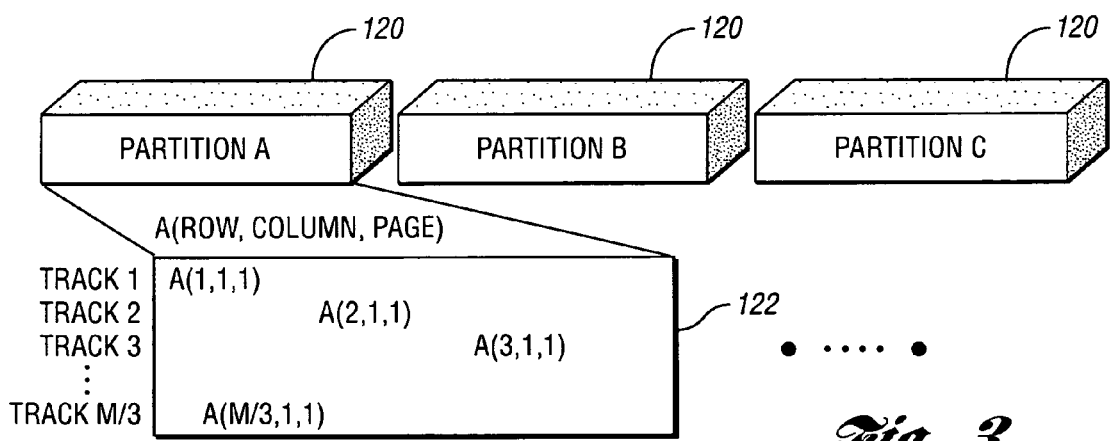
FIG. 3 is a block diagram representing a shortened ECC interleaving arrangement and resulting multi-dimensional matrix in accordance with the present invention.

An example of the dynamic ECC shortening in accordance with the present invention is shown in FIG. 3. In the example, three partitions 120, labeled A, B, C in the drawing, are available for holding segments of the user data. In contrast to typical ECC interleaving arrangements, the present invention does not use pad bytes to fill out all three partitions if the number of bytes of user data communicated from the data buffer is sufficient to fill only one of the partitions, such as partition C. Instead, only that partition is filled, and the number of ECC codewords is shortened to correspond to the size of the user data, i.e., the codewords are shortened by 2*M/3 so that only partition C is filled.

As denoted in box 122, each ECC word is divided into segments having a predetermined number of bytes, and recorded on a different track on the recording medium. The codeword in this instance would be represented only as C(1, 1, 1), C(2, 1, 1), C(3, 1, 1), C(M/3, 1, 1). Thus, a complete interleave is provided even though there is only a partial fill of user data.

Likewise, if the number of user bytes fills two of the partitions, such as partition B and C, then the number of codewords are shortened by M/3 so that only the ECC codewords for partition B and C are written. The codeword would be represented as B(1, 1, 1), B(2, 1, 1), B(3, 1, 1), ..., B(M/3, 1, 1), C(1, 1, 1), C(2, 1, 1), C(3, 1, 1), ..., C(M/3, 1, 1).

Finally, if the number of bytes is sufficient to fill all three partitions, the user data is segmented and written so that all three partitions are filled. Accordingly, the full ECC codewords are used.

Figure 4:
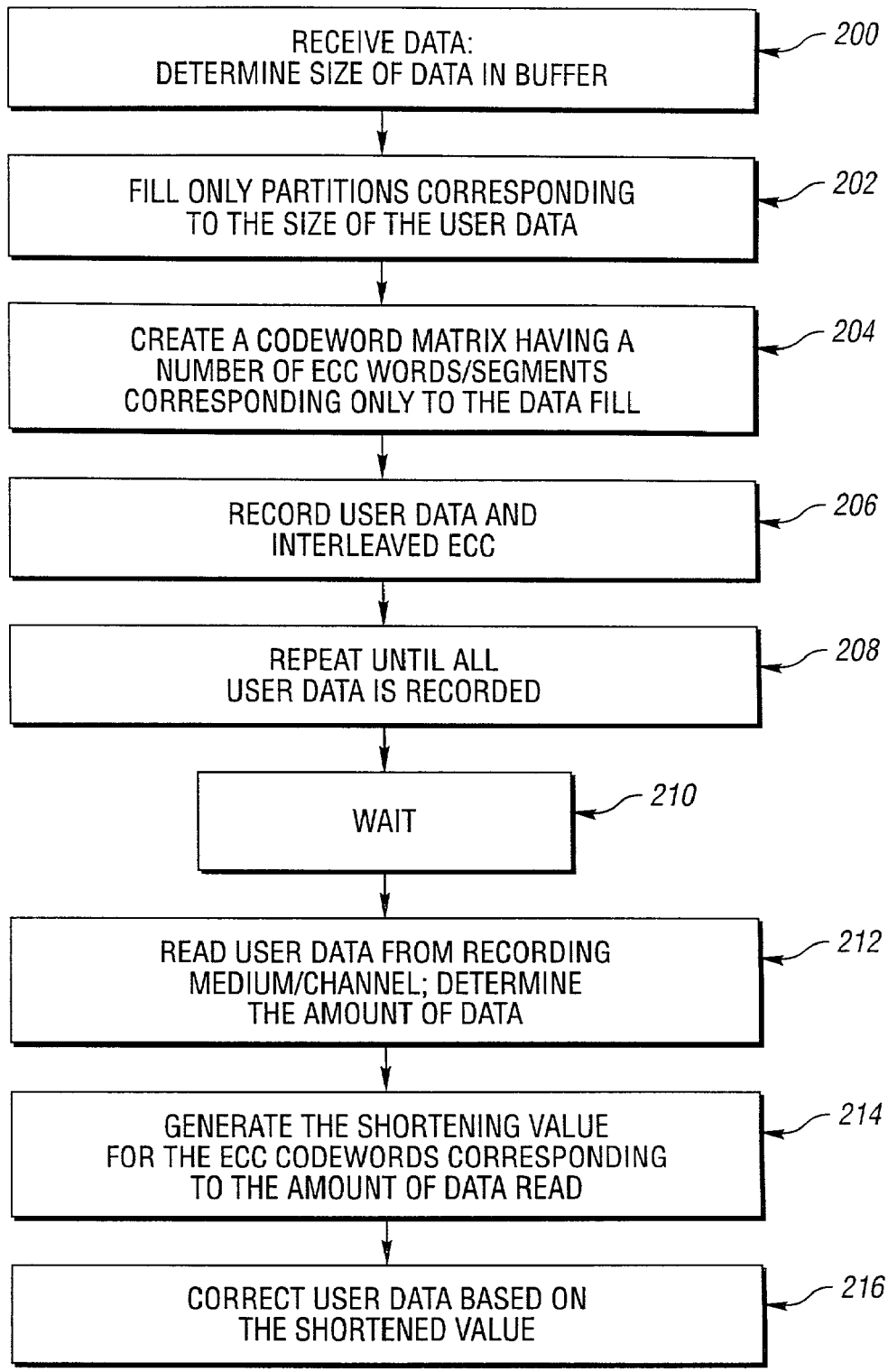
FIG. 4 is a flowchart illustrating the overall process of the present invention.

The overall process of the present invention is summarized in the flowchart of FIG. 4. As denoted at block 200, the size of user data received by the data buffer is automatically determined. At block 202, only partitions corresponding the size of the user data are filled. In addition, knowing the amount of data present is used at block 204 to automatically create a codeword matrix having error correction codeword segments corresponding only to the portion of the codeword matrix filled by the user data. The user data and interleaved ECC is then recorded on a recording medium or channel at block 206. As denoted at block 208, this process is repeated until all data is recorded.

As indicated at block 210, the system waits (i.e., by using the term "wait," one of ordinary skill will readily appreciate that the system can/will still execute other operations and/or subroutines not related to the present invention) until time to read the recorded data from the storage channel. At block 212, the data is read from the storage channel. The amount of data read is automatically determined as well. At block 214, the shortening value of the ECC codewords corresponding to the amount of data read from the storage channel is generated. Finally, at block 216, the user data is corrected accordingly based on the shortening value.

Thus, the present invention advantageously eliminates the requirement that the ECC codeword matrix be filled entirely with data. Successful interleaving is provided even though the matrix may only be partially full of user data. In addition, the corresponding number of recording passes is likewise reduced.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of dynamically shortening error correction codewords in an error correction code interleaving arrangement that divides error correction codewords into segments for recording across a matrix, the method comprising:

defining a matrix wherein the matrix comprises user data and error correction codewords;

receiving user data for recording on a storage medium;

determining the size of the received user data and the amount of the matrix that will be filled by the received user data; and recording error correction codewords segments in an interleave dynamically created to correspond only to the portion of the matrix filled by the user data.

2. The method of claim 1 wherein the user data is partitioned for recording onto the recording medium in a plurality of tracks, and each error correction codeword segment is recorded on a separate track.

3. The method of claim 1 wherein the matrix includes a predetermined number of partitions each dimensioned to hold a predetermined number of bytes of user data.

4. The method of claim 3 wherein if the user data does not fill all the partitions, shortening the error correction codewords to provide an interleave of the error correction codeword segments corresponding to the number of partitions filed by the user data.

5. The method of claim 1 further comprising:
reading the data from the storage medium;
determining when the data only fills a portion of the matrix; and
automatically recreating the error correction codewords as a function of the dynamically created interleave recorded on the medium.

6. The method of claim 5 wherein reading the data from the storage medium comprises determining the shortening value of error codewords corresponding the partial data fill.

7. A system for dynamically shortening error correction codewords used in an error correction code interleaving comprising:
a data buffer for receiving user data, the data buffer including a processing arrangement for determining the amount of data received in the data buffer;
an error correction code write buffer connected to the data buffer for receiving the user data as well as an indication of the amount of data, the write buffer including a processing arrangement for dynamically determining a shortening value for error correction codewords that correspond to the amount of user data, and recording the user data and error correction codeword segments dynamically in an interleave created to correspond only to the portion of the matrix filled by the user data on a recording medium.

8. The system of claim 7 wherein the write buffer processing arrangement is further arranged to divide each of the determined number of error correction codewords into a plurality of segments, and each segment is recorded on a different track.

9. The system of claim 7 wherein the write buffer processing arrangement is further arranged to process the user data into a predetermined number of partitions each dimensioned to hold a predetermined number of bytes of user data, and only partitions corresponding to the amount of user data are filled.

10. The system of claim 7 wherein the write buffer processing arrangement is further arranged to determine an amount of an error correction codeword matrix that will be filled by the received user data, the shortening size of the error correction codewords is determined to correspond only to the portion of the matrix filled by the user data.

11. The system of claim 7 further comprising:
an error correction read buffer having a processing arrangement for reading the data from the storage medium, and determining that the data only fills a portion of an error correction codeword matrix, wherein the read buffer processing arrangement automatically determines the shortening value of the error correction codewords corresponding the partial data fill.

12. The method of claim 1 wherein determining the amount of matrix that will be filled by the received user data comprises determining the number of partitions filled by the user data.

* * * * *